(12) United States Patent
Chen et al.

(10) Patent No.: US 10,186,602 B2
(45) Date of Patent: Jan. 22, 2019

(54) FIN STRUCTURE OF SEMICONDUCTOR DEVICE

(71) Applicant: Taiwan Semiconductor Manufacturing Company, Ltd., Hsin-Chu (TW)

(72) Inventors: Yen-Yu Chen, Taipei (TW); Hung-Yao Chen, Hsin-Chu (TW); Chi-Yuan Shih, Hsin-Chu (TW); Ling-Yen Yeh, Hsin-Chu (TW); Clement Hsingjen Wann, Carmel, NY (US)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 11 days.

(21) Appl. No.: 15/277,777

(22) Filed: Sep. 27, 2016

(65) Prior Publication Data

US 2017/0018629 A1    Jan. 19, 2017

Related U.S. Application Data

(62) Division of application No. 14/137,725, filed on Dec. 20, 2013, now Pat. No. 9,472,652.

(51) Int. Cl.
*H01L 29/66* (2006.01)
*H01L 29/06* (2006.01)
*H01L 21/762* (2006.01)
*H01L 21/02* (2006.01)
(Continued)

(52) U.S. Cl.
CPC .... *H01L 29/66795* (2013.01); *H01L 21/0228* (2013.01); *H01L 21/32105* (2013.01);
(Continued)

(58) Field of Classification Search
CPC .......... H01L 29/66795; H01L 21/0228; H01L 21/32105; H01L 21/76224;
(Continued)

(56) References Cited

U.S. PATENT DOCUMENTS 6,693,047 B1 *   2/2004   Lu .................... H01L 21/02032
                                                         257/E21.214
2004/0262687 A1   12/2004  Jung et al.
(Continued)

FOREIGN PATENT DOCUMENTS

| CN | 102301480 A | 12/2011 |
| KR | 1020050001165 A | 1/2005 |
| KR | 1020130128298 A | 11/2013 |

*Primary Examiner* — Mohsen Ahmadi
*Assistant Examiner* — Patricia Reddington
(74) *Attorney, Agent, or Firm* — Slater Matsil, LLP

(57) ABSTRACT

The disclosure relates to a fin field effect transistor (Fin-FET). An exemplary FinFET comprises a substrate comprising a major surface; a fin structure protruding from the major surface comprising an upper portion comprising a first semiconductor material having a first lattice constant, wherein the upper portion comprises a first substantially vertical portion having a first width and a second substantially vertical portion having a second width less than the first width over the first substantially vertical portion; and a lower portion comprising a second semiconductor material having a second lattice constant less than the first lattice constant, wherein a top surface of the lower portion has a third width less than the first width; and a gate structure covering the second substantially vertical portion.

20 Claims, 13 Drawing Sheets

(51) Int. Cl.
*H01L 21/321* (2006.01)
*H01L 21/8234* (2006.01)
*H01L 27/088* (2006.01)
*H01L 29/10* (2006.01)
*H01L 21/8238* (2006.01)
*H01L 29/78* (2006.01)

(52) U.S. Cl.
CPC ............ *H01L 21/76224* (2013.01); *H01L 21/823431* (2013.01); *H01L 21/823481* (2013.01); *H01L 27/0886* (2013.01); *H01L 29/0649* (2013.01); *H01L 29/1054* (2013.01); *H01L 29/7853* (2013.01); *H01L 21/823821* (2013.01); *H01L 29/785* (2013.01)

(58) Field of Classification Search
CPC ......... H01L 21/823431; H01L 27/0886; H01L 29/0649; H01L 29/1054; H01L 29/7853; H01L 21/823821; H01L 29/785
USPC ............................................. 257/401
See application file for complete search history.

(56) References Cited

U.S. PATENT DOCUMENTS

| | | | |
|---|---|---|---|
| 2007/0281493 A1* | 12/2007 | Fucsko | H01L 21/30608 438/739 |
| 2009/0294840 A1* | 12/2009 | Gilgen | H01L 21/823431 257/327 |
| 2010/0207208 A1 | 8/2010 | Bedell et al. | |
| 2011/0079829 A1 | 4/2011 | Lai et al. | |
| 2011/0233659 A1* | 9/2011 | Tai | H01L 29/407 257/330 |
| 2013/0193446 A1 | 8/2013 | Chao et al. | |
| 2013/0307021 A1 | 11/2013 | Ching et al. | |
| 2014/0065782 A1* | 3/2014 | Lu | H01L 29/785 438/294 |
| 2014/0217517 A1 | 8/2014 | Cai et al. | |
| 2015/0145065 A1* | 5/2015 | Kanakasabapathy | H01L 27/0886 257/401 |
| 2017/0077095 A1* | 3/2017 | Lu | H01L 21/2652 |

* cited by examiner

FIN STRUCTURE OF SEMICONDUCTOR DEVICE

CROSS-REFERENCE AND PRIORITY

This application is a divisional of U.S. application Ser. No. 14/137,725, filed on Dec. 20, 2013, entitled "Fin Structure of Semiconductor Device," which application is hereby incorporated herein by reference.

TECHNICAL FIELD

The disclosure relates to integrated circuit fabrication, and more particularly to a semiconductor device with a fin structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, non-uniform composition distribution of a fin structure causes fluctuation of FinFET characteristics such as increased leakage current, thereby degrading the device performance. As the gate length and spacing between devices decrease, these problems are exacerbated.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
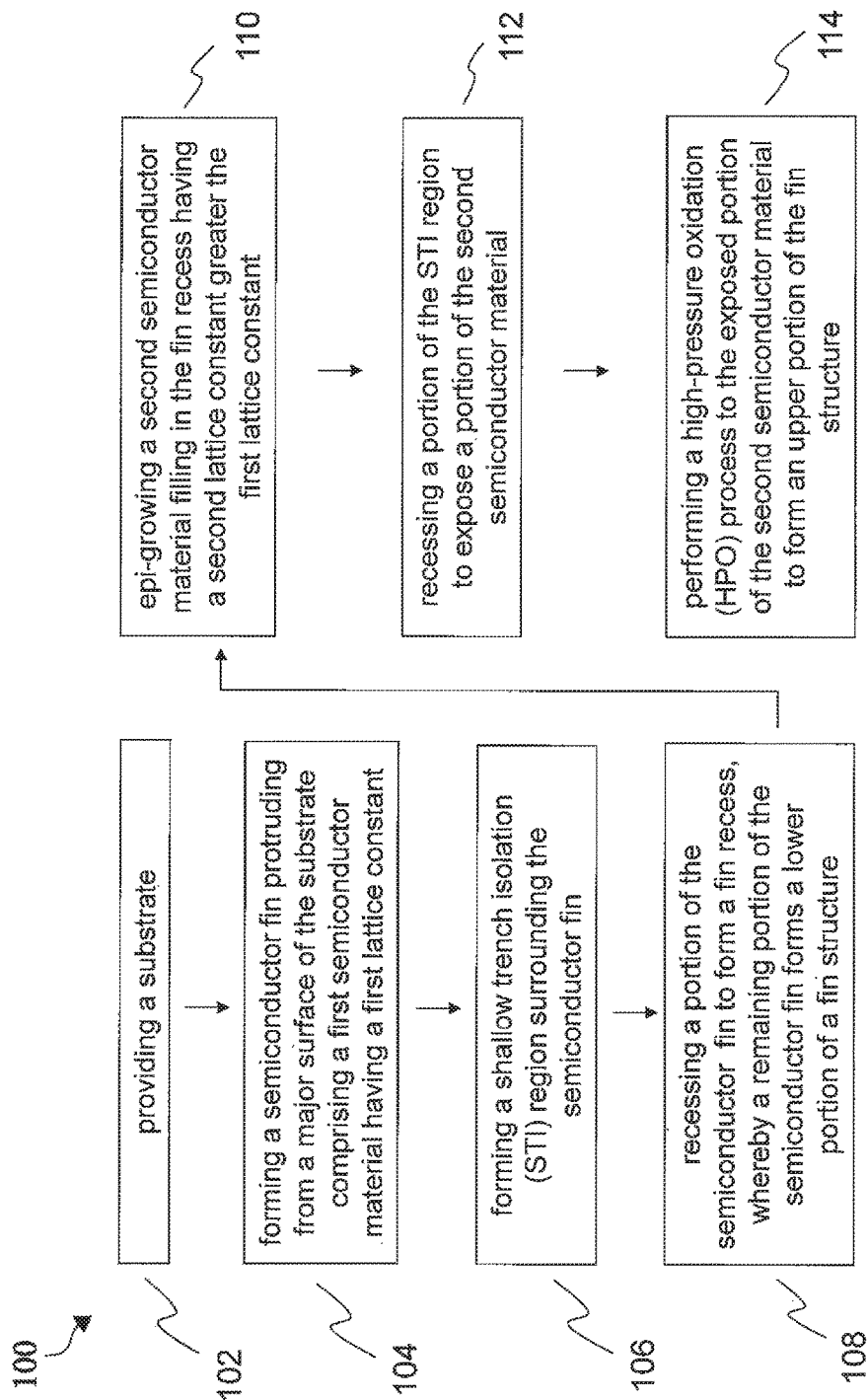
FIG. 1 is a flowchart illustrating a method of fabricating a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a semiconductor device according to various aspects of the present disclosure. The method 100 begins with step 102 in which a substrate is provided. The method 100 continues with step 104 in which a semiconductor fin is formed protruding from a major surface of the substrate comprising a first semiconductor material having a first lattice constant. The method 100 continues with step 106 in which a shallow trench isolation (STI) region is formed surrounding the semiconductor fin.

The method 100 continues with step 108 in which a portion of the semiconductor fin is recessed to form a fin recess, whereby a remaining portion of the semiconductor fin forms a lower portion of a fin structure. The method 100 continues with step 110 in which a second semiconductor material is epi-grown filling in the fin recess having a second lattice constant greater the first lattice constant. The method 100 continues with step 112 in which a portion of the STI region is recessed to expose a portion of the second semiconductor material.

The method 100 continues with step 114 in which a high-pressure oxidation (HPO) process is performed to the exposed portion of the second semiconductor material to form an upper portion of the fin structure. The discussion that follows illustrates embodiments of semiconductor devices that can be fabricated according to the method 100 of FIG. 1.

Figure 2:
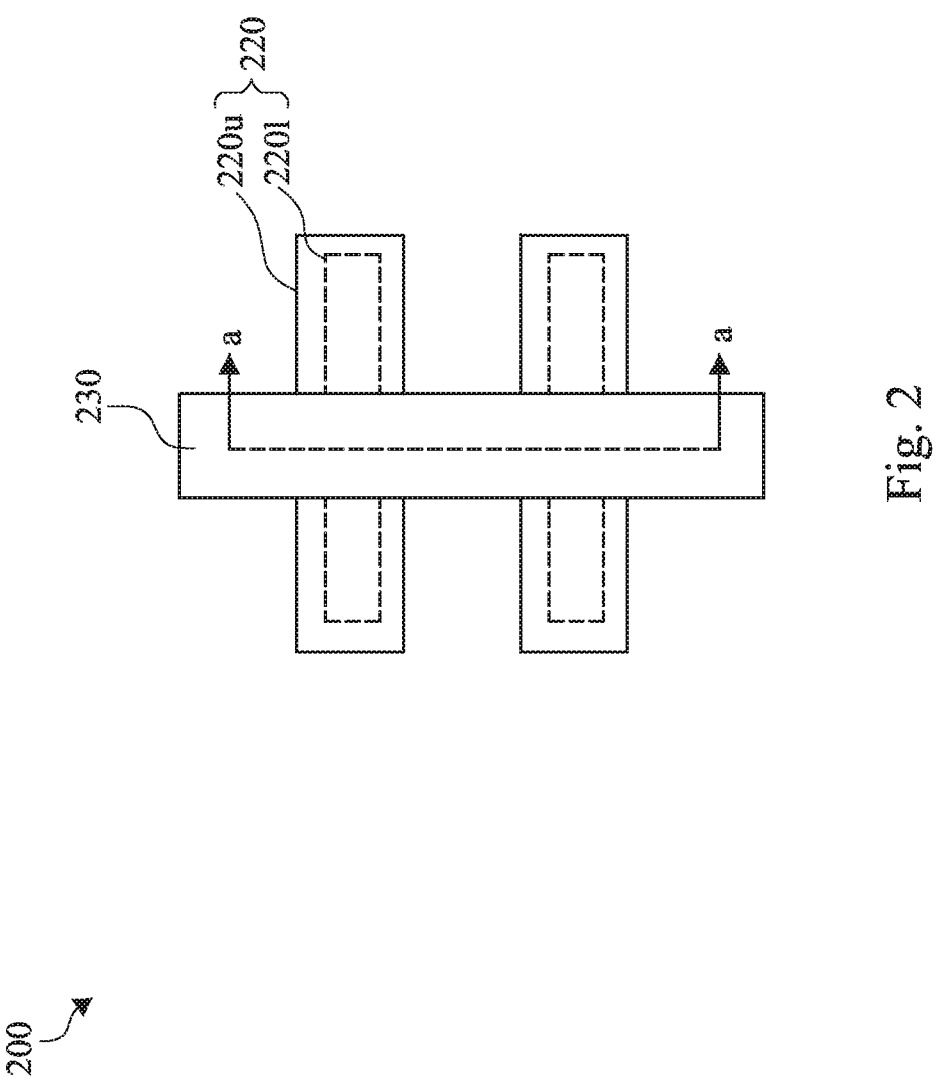
FIG. 2 shows a top view of a semiconductor device comprising a fin structure according to various aspects of the present disclosure.

FIG. 2 shows a top view of a semiconductor device 200 comprising a fin structure 220 according to various aspects of the present disclosure. FIGS. 3-13 are cross-sectional views of a semiconductor device 200 taken along the line a-a of FIG. 2 at various stages of fabrication according to various embodiment of the present disclosure. As employed in the present disclosure, the term semiconductor device 200 refers to a fin field effect transistor (FinFET) and is hereinafter referred to as FinFET 200. The FinFET 200 refers to any fin-based, multi-gate transistor. Other transistor structures and analogous structures are within the contemplated scope of the disclosure. The FinFET 200 may be included in a microprocessor, memory cell, and/or other integrated circuit (IC).

It is noted that the method of FIG. 1 does not produce a completed FinFET 200. A completed FinFET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 13 are simplified for a better understanding of the concepts of the present disclosure. For example, although the figures illustrate the FinFET 200, it is understood the IC may comprise a number of other devices comprising resistors, capacitors, inductors, fuses, etc.

FIG. 2 illustrates a FinFET 200 fabricated using the steps in FIG. 1. For illustration, the FinFET 200 comprises a fin structure 220 and a gate structure 230 traversing over a channel portion of the fin structure 220. In some embodiments, the fin structure 220 comprises an upper portion 220u (solid line) and a lower portion 220l (dashed line). For illustration, the FinFET 200 comprises two fins. In some embodiments, the FinFET 200 may comprise less than or greater than two fins, for example, one fin or three fins.

Figure 3:
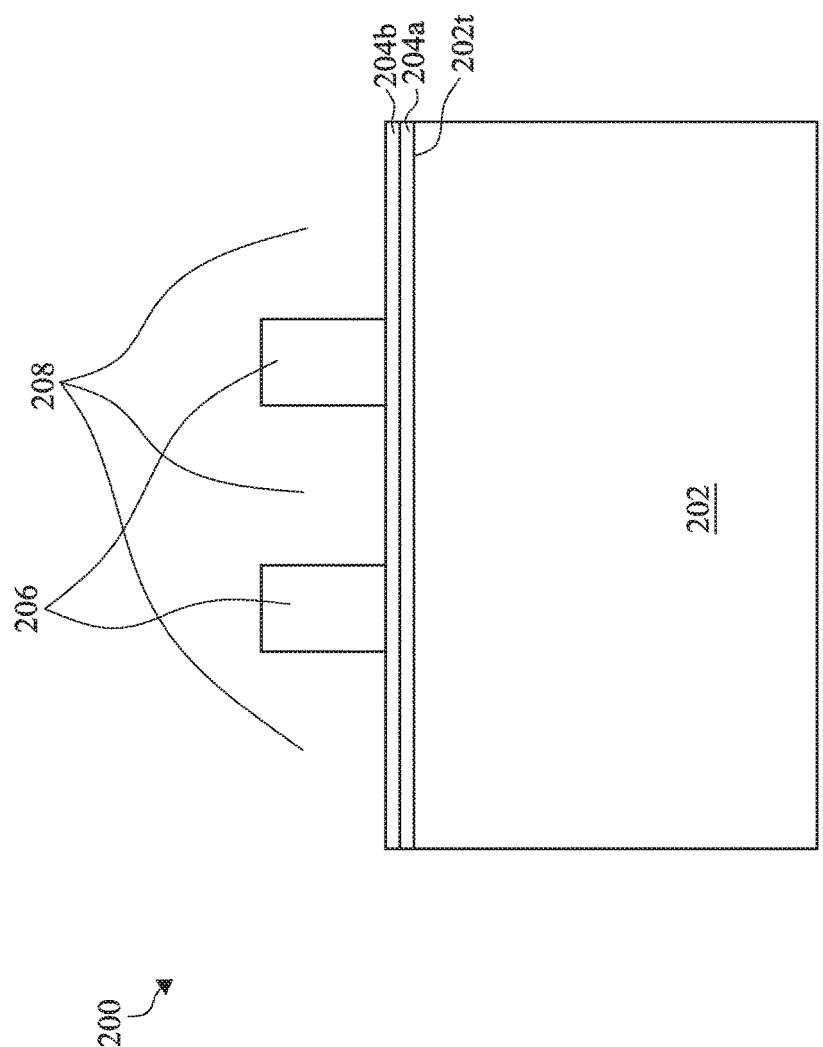
FIGS. 3-13 are cross-sectional views of a semiconductor device at various stages of fabrication according to various embodiment of the present disclosure.

As depicted in FIG. 3 and step 102 in FIG. 1, a substrate 202 is provided. In one embodiment, the substrate 202 comprises a semiconductor substrate (e.g., Si, SiGe, or SiGeB). In alternative embodiments, the substrate 202 comprises a silicon-on-insulator (SOI) structure. The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In one embodiment, a pad layer 204a and a mask layer 204b are formed on a top surface 202t of the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In an embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A photo-sensitive layer 206 is formed on the mask layer 204b and is then patterned, forming openings 208 in the photo-sensitive layer 206.

Figure 4:
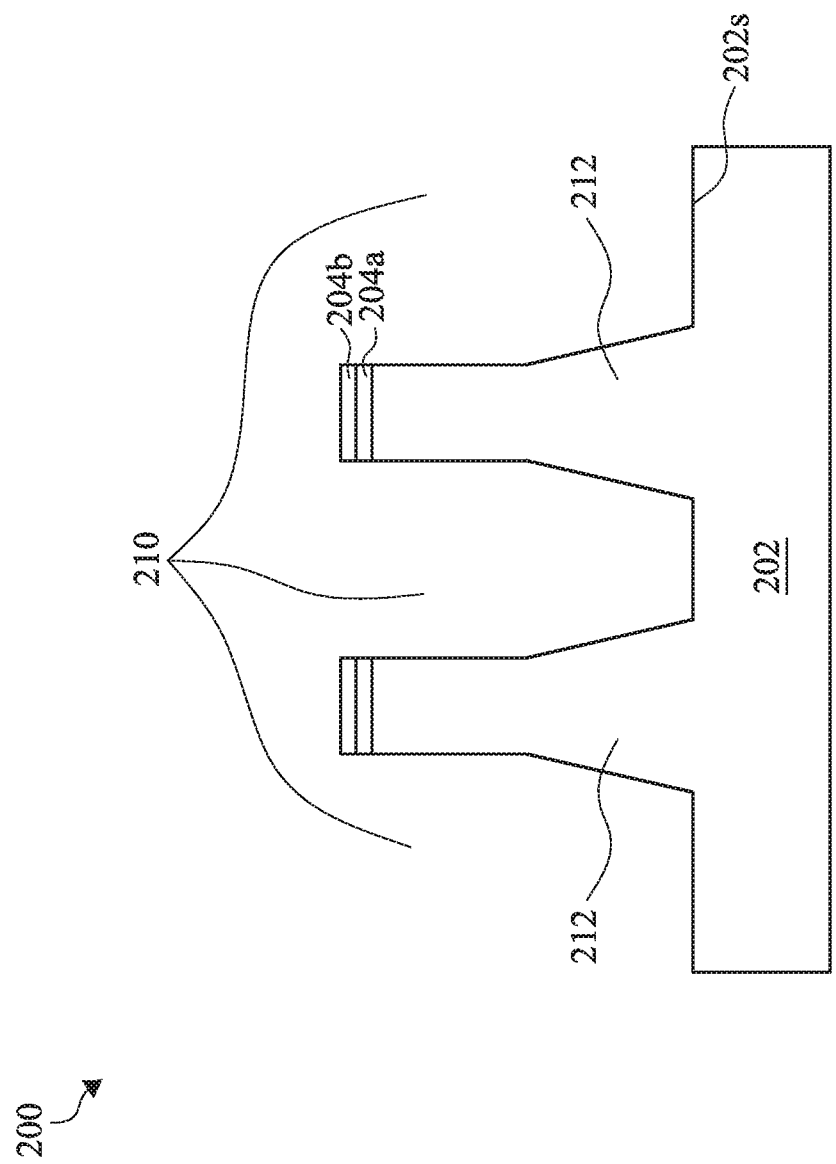

As depicted in FIG. 4 and step 104 in FIG. 1, the structure in FIG. 4 is produced by forming a semiconductor fin 212 protruding from a major surface 202s of the substrate 202 comprising a first semiconductor material having a first lattice constant and hence is also referred to as first semiconductor material 202 in the present disclosure.

In some embodiments, the mask layer 204b and pad layer 204a are etched through openings 208 to expose underlying semiconductor substrate 202. The exposed semiconductor substrate 202 is then etched to form trenches 210 with the major surfaces 202s of the semiconductor substrate 202. Portions of the semiconductor substrate 202 between trenches 210 form the semiconductor fins 212. In some embodiments, the trenches 210 may be strips (viewed from in the top of the FinFET 200) parallel to each other, and closely spaced with respect to each other. In some embodiments, the trenches 210 may be continuous and surrounding the semiconductor fins 212.

In the depicted embodiment, the semiconductor fins 212 protruding from the substrate major surface 202s comprises two fins. The photo-sensitive layer 206 is then removed. Next, a cleaning may be performed to remove a native oxide of the semiconductor substrate 202. The cleaning may be performed using diluted hydrofluoric (DHF) acid.

Liner oxide (not shown) is then optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces the electrical fields, and hence improves the performance of the resulting integrated circuit.

Figure 5:
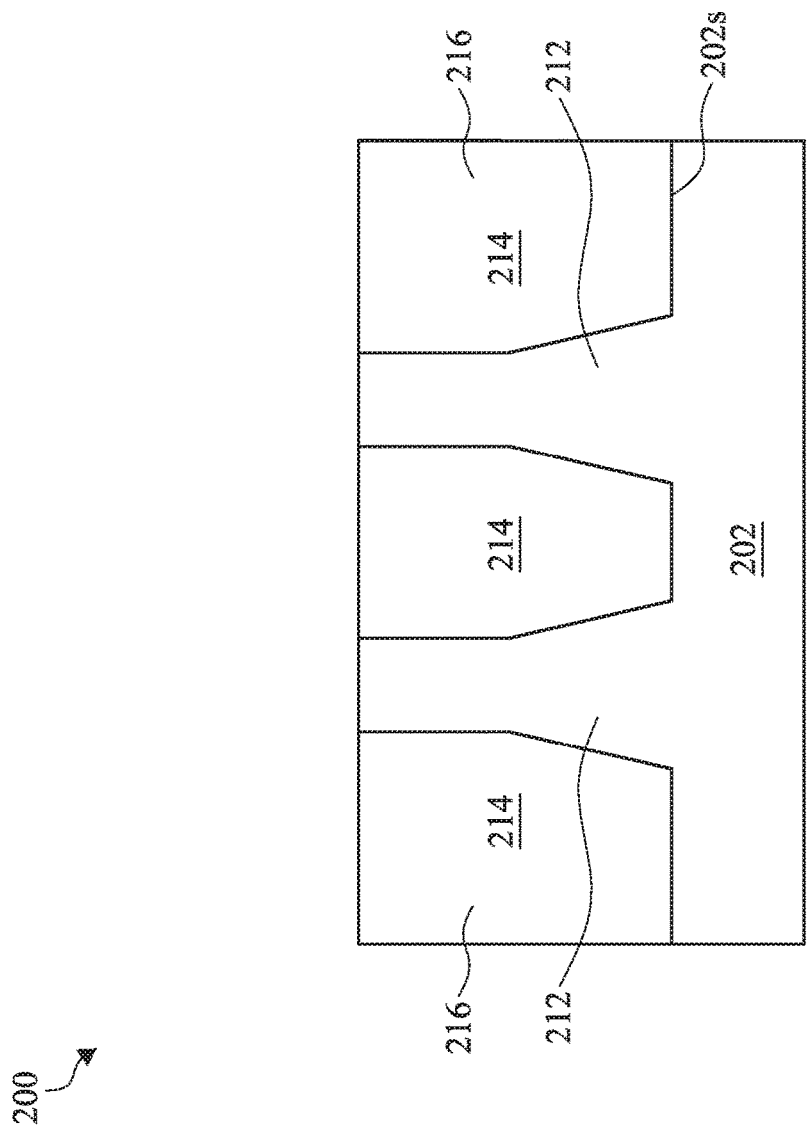

As depicted in FIG. 5 and step 106 in FIG. 1, the structure in FIG. 5 is produced by forming a shallow-trench-isolation (STI) region 216 surrounding the semiconductor fin 212. In some embodiments, the trenches 210 are filled with the dielectric material 214. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used. In some embodiments, the oxide 214 may be formed using a high-density-plasma (HDP) CVD process, using silane ($SiH_4$) and oxygen ($O_2$) as reacting precursors. In other embodiment, the oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 214 may be formed using a spin-on-dielectric (SOD) process, such as hydrogen silsesquioxane (HSQ) or methyl silsesquioxane (MSQ).

A chemical mechanical polish (CMP) is then performed to form the STI regions 216, followed by the removal of the mask layer 204b and pad layer 204a. In one embodiment, the mask layer 204b is formed of silicon nitride, the mask layer 204b may be removed using a wet process using hot $H_3PO_4$, while pad layer 204a may be removed using DHF acid, if formed of silicon oxide.

Figure 6:
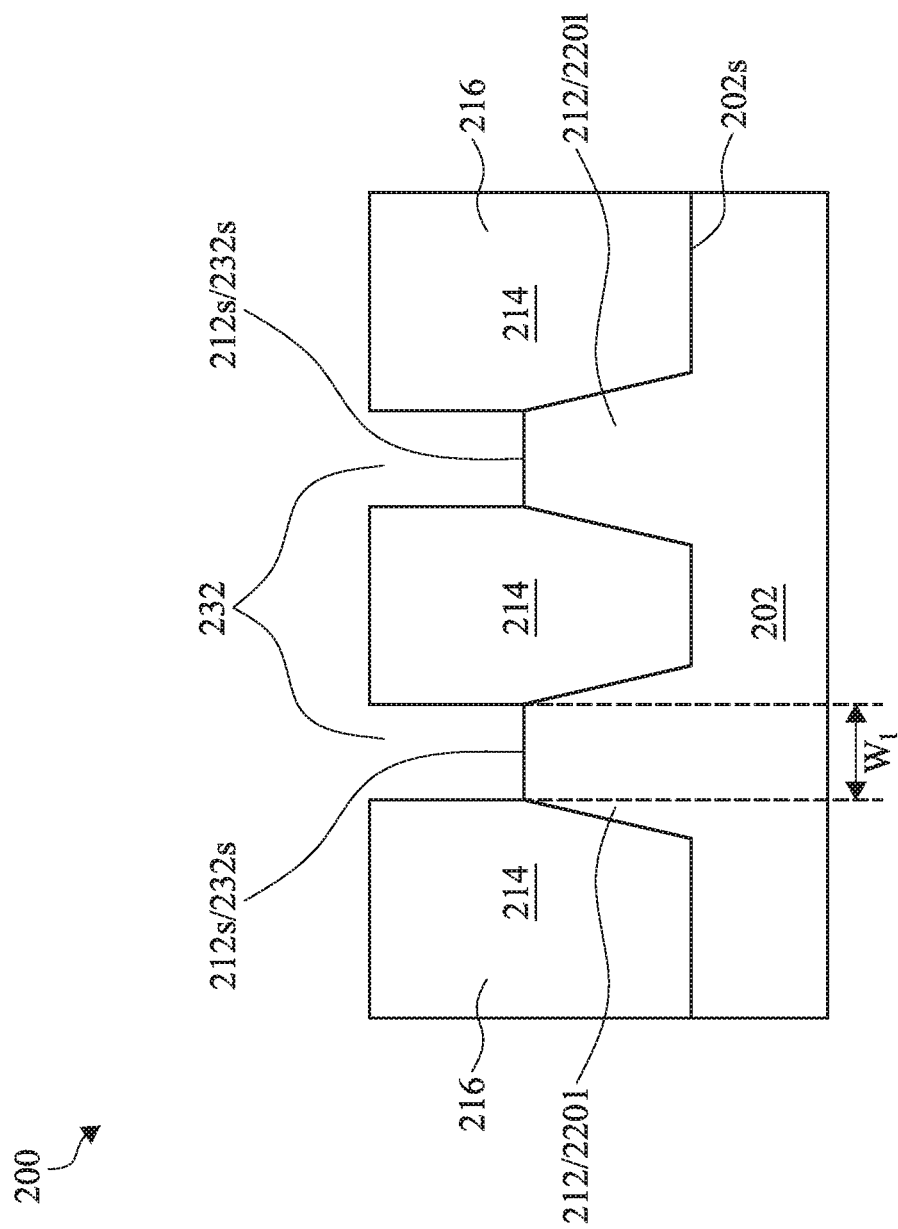
Figure 7:
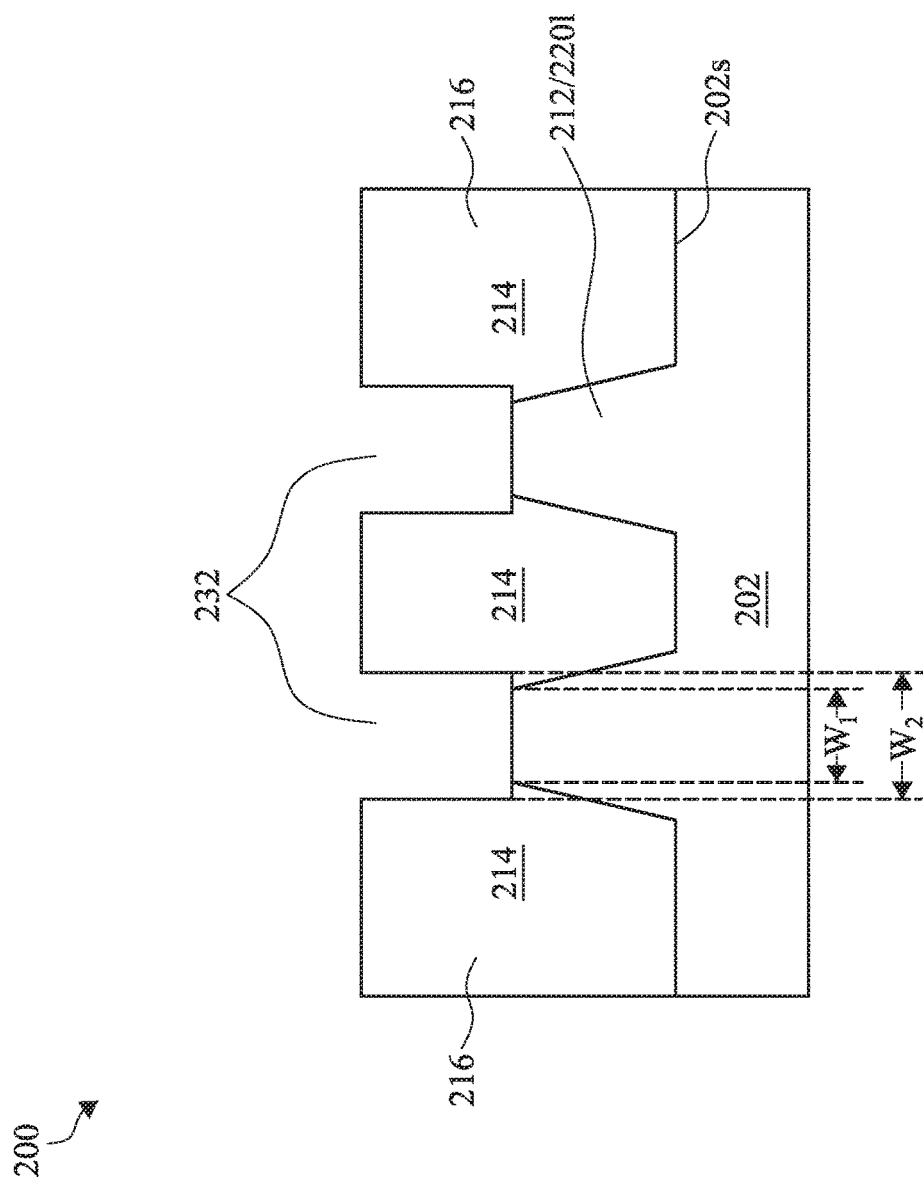
Figure 8:
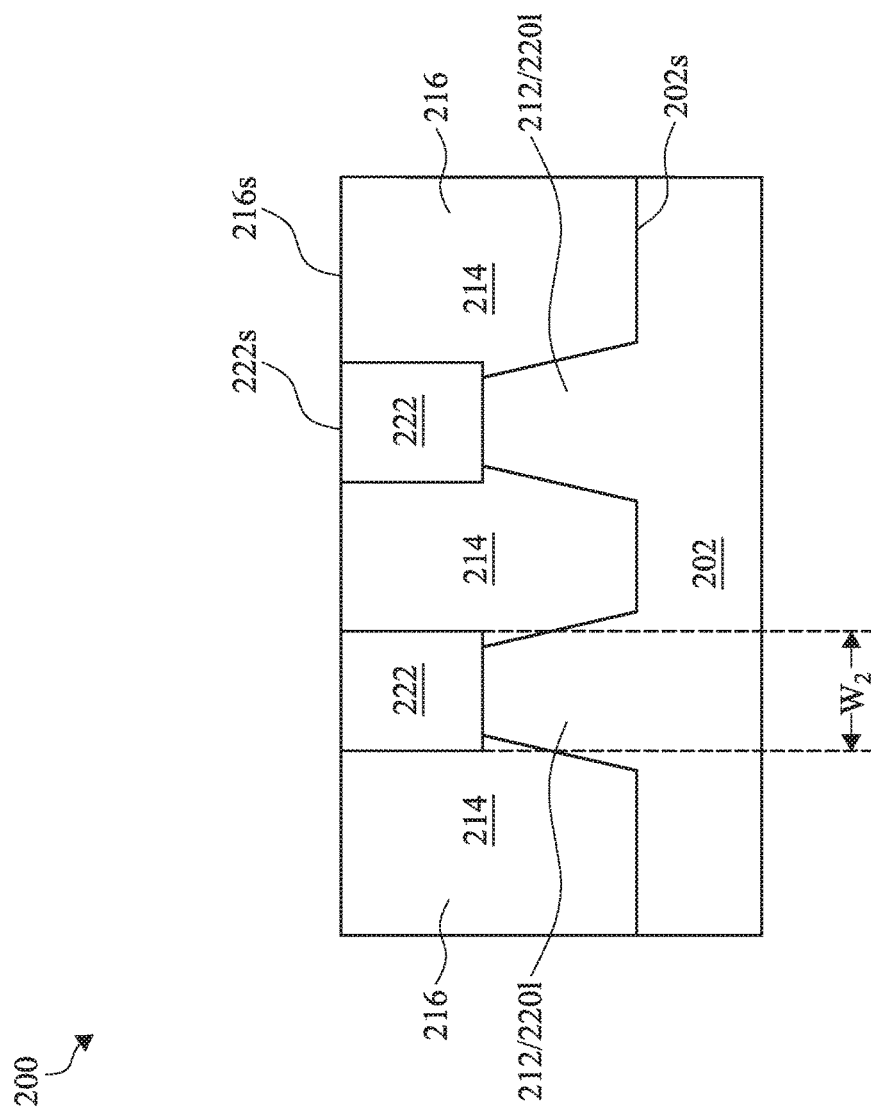

As depicted in FIGS. 6, 7, and 8, upper portions of the semiconductor fins 212 are replaced by other semiconductor material to enhance device performance. The structure in FIG. 6 is produced by recessing a portion of the semiconductor fin 212 to form a fin recess 232, whereby a remaining portion of the semiconductor fin 212 forms a lower portion 220l of a fin structure 220 (step 108 in FIG. 1). In some embodiments, a bottom surface 232s of the fin recess 232 (i.e., a first top surface 212s of the lower portion 220l) has a first width $W_1$. Further, the fin recess 232 has substantially vertical sidewalls.

Using the STI regions 216 as a hard mask, an anisotropic plasma etching process is performed to recess the semiconductor fins 212 that are unprotected or exposed to form fin recesses 232 between the neighboring STI regions 216. The remaining portions of the semiconductor fins 212 between the neighboring STI regions 216 are hereinafter referred to as the lower portion 220l of the fin structure 220, protruding from the major surface 202s of the substrate 202. In some embodiments, the lower portion 220l may include the first semiconductor material 202 having the first lattice constant. In some embodiments, the first semiconductor material 202 comprises Si, SiGe, or SiGeB. In some embodiments, the etching process may be performed using a chemical selected from $Cl_2$, HBr, $NF_3$, $CF_4$, and $SF_6$ as an etching gas.

Next, a cleaning may be performed using DHF acid to remove a native oxide of exposed portion of the first semiconductor material 202 (i.e. top surface 212s) and portions of sidewalls of the STI regions 216, if formed of silicon oxide (shown in FIG. 7). As such, the fin recess 232 widens from the first width $W_1$ to a second width $W_2$. In some embodiments, the widened fin recess 232 also has substantially vertical sidewalls.

As depicted in FIG. 8 and step 110 in FIG. 1, the structure in FIG. 8 is produced by epi-growing a second semiconductor material 222 filling in the fin recess 232 having a second lattice constant greater the first lattice constant. In some embodiments, the second semiconductor material 222 comprises Ge, SiGe, or SiGeB.

In some embodiments, the second semiconductor material 222 comprises Ge. In the depicted embodiment, the second semiconductor material 222 such as Ge is selectively grown by an LPCVD process to fill in the fin recess 232. In one embodiment, the LPCVD process is performed at a temperature of about 350° C. to 450° C. and under a pressure of about 10 mTorr to about 100 mTorr, using $GeH_4$, $GeH_3CH_3$, and/or $(GeH_3)_2CH_2$ as epitaxial gases. Optionally, an anneal process after the growing process is performed at a temperature of about 550° C. to 750° C. to confine dislocation defects on the interface of the Si and Ge epitaxial layer.

In some embodiments, the second semiconductor material 222 comprises SiGe or SiGeB. In the depicted embodiment, the second semiconductor material 222 such as SiGe or SiGeB is selectively grown by an LPCVD process to fill in the fin recess 232. In one embodiment, the LPCVD process is performed at a temperature of about 400° C. to about 800° C. and under a pressure of about 1 Torr to about 200 Torr, using $SiH_2Cl_2$, $SiH_4$, $GeH_4$, HCl, $B_2H_6$, and $H_2$ as reaction gases.

After the growing, a planarization such as a CMP is performed, so that a top surface 222s of the second semiconductor material 222 is substantially level with a top surface 216s of the STI regions 216. Further, the second semiconductor material 222 along the substantially vertical sidewalls of the widened fin recess 232 thus comprises a first substantially vertical portion 222b (such as unexposed portion 222b of the second semiconductor material 222 shown in FIG. 9) having the second width $W_2$.

Figure 9:
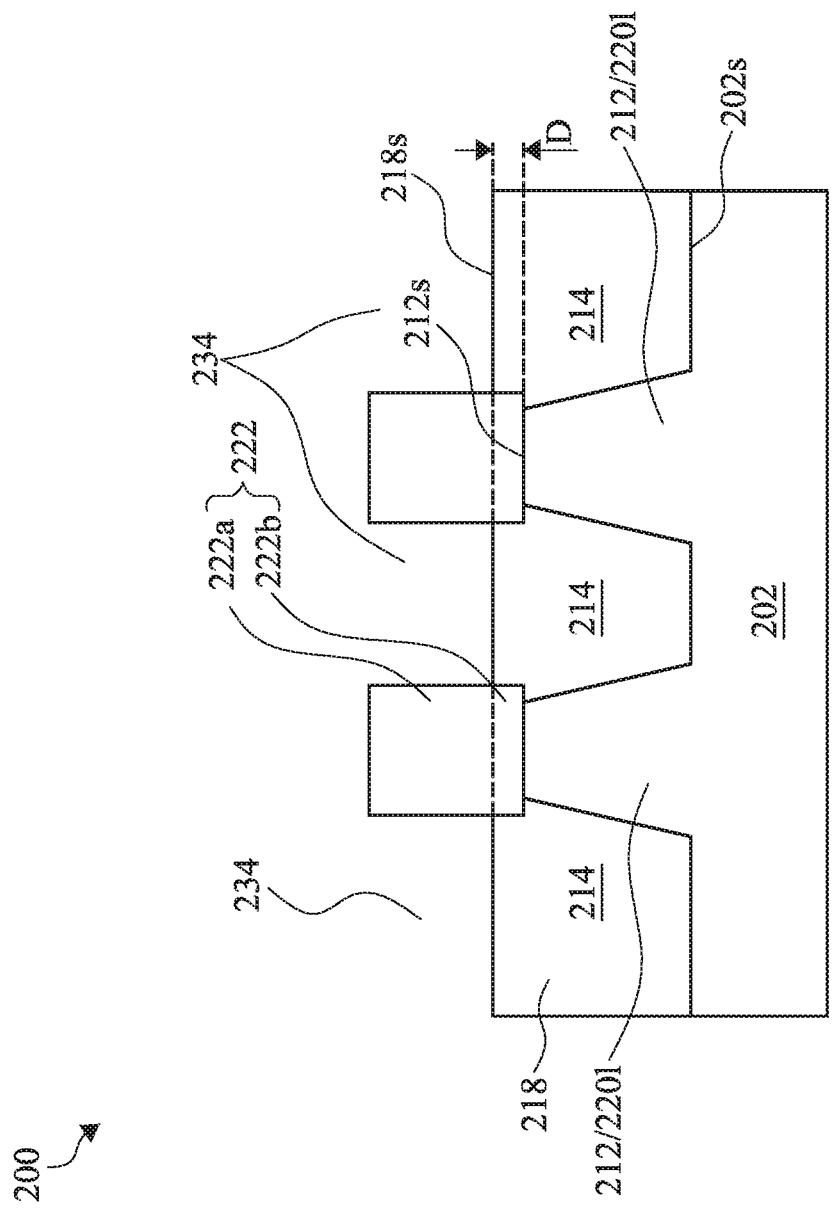

As depicted in FIG. 9 and step 112 in FIG. 1, the structure in FIG. 9 is produced by recessing a portion of the STI region 216 to expose a portion 222a of the second semiconductor material 222, resulting in STI recesses 234, a remaining oxide 214, and an unexposed portion 222b of the second semiconductor material 222. The remaining oxide 214 surrounding the fin structure 220 is hereinafter referred to as an isolation structure 218, wherein a second top surface 218s of the isolation structure 218 is equal to or higher than the first top surface 212s. In some embodiments, a distance D between the first top surface 212s and second top surface 218s is from about 0 nm to about 5 nm. Further, the unexposed portion 222b is hereinafter referred to as the first substantially vertical portion 222b.

In some embodiments, the recessing step may be performed using a wet etching process, for example, by dipping the substrate 202 in hydrofluoric acid (HF). In some embodiments, the etching step may be performed using a dry etching process, for example, the dry etching process may be performed using $CHF_3$ or $BF_3$ as etching gases.

The process steps up to this point have provided the substrate 202 having the second semiconductor material 222 lying on the lower portion 220l of the fin structure 220. Conventionally, using an in-situ stream generation (ISSG) oxidation process, the exposed portion 222a of the second semiconductor material 222 is oxidized to form a thinner fin for channel portion of a FinFET. However, since the ISSG oxidation process is performed at a high temperature of about 900° C. to about 1100° C., Ge in the second semiconductor material 222 (e.g., Ge, SiGe, or SiGeB) may diffuse into the lower portion 220l of the fin structure 220 (e.g., Si). Non-uniform composition distribution of the fin structure 220 may cause fluctuation of FinFET characteristics such as increased leakage current, thereby degrading the device performance.

Accordingly, the processing discussed below with reference to FIG. 11 may form a fin structure with uniform composition distribution. Problems associated with high leakage current due to non-uniform composition distribution of the fin structure 220 may be reduced and/or avoided. Thus, Applicant's method may achieve the desired device performance characteristics, such as low leakage current.

Figure 11:
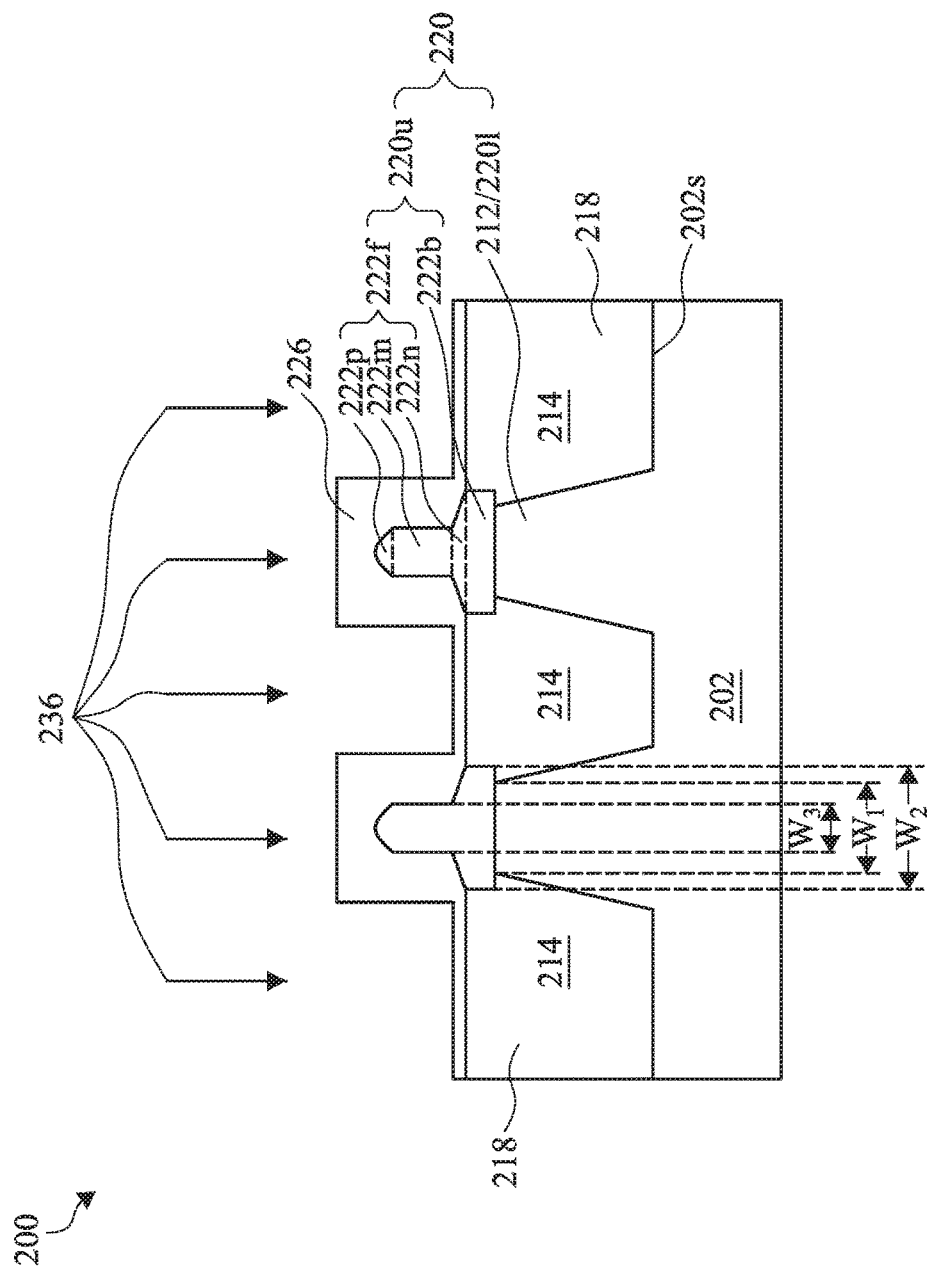

As depicted in FIG. 11 and step 114 in FIG. 1, for fabricating a fin structure with uniform composition distribution, the structure in FIG. 11 is produced by performing a high-pressure oxidation (HPO) process 236 to the exposed portion 222a of the second semiconductor material 222 to form an upper portion 220u of the fin structure 220.

Figure 10:
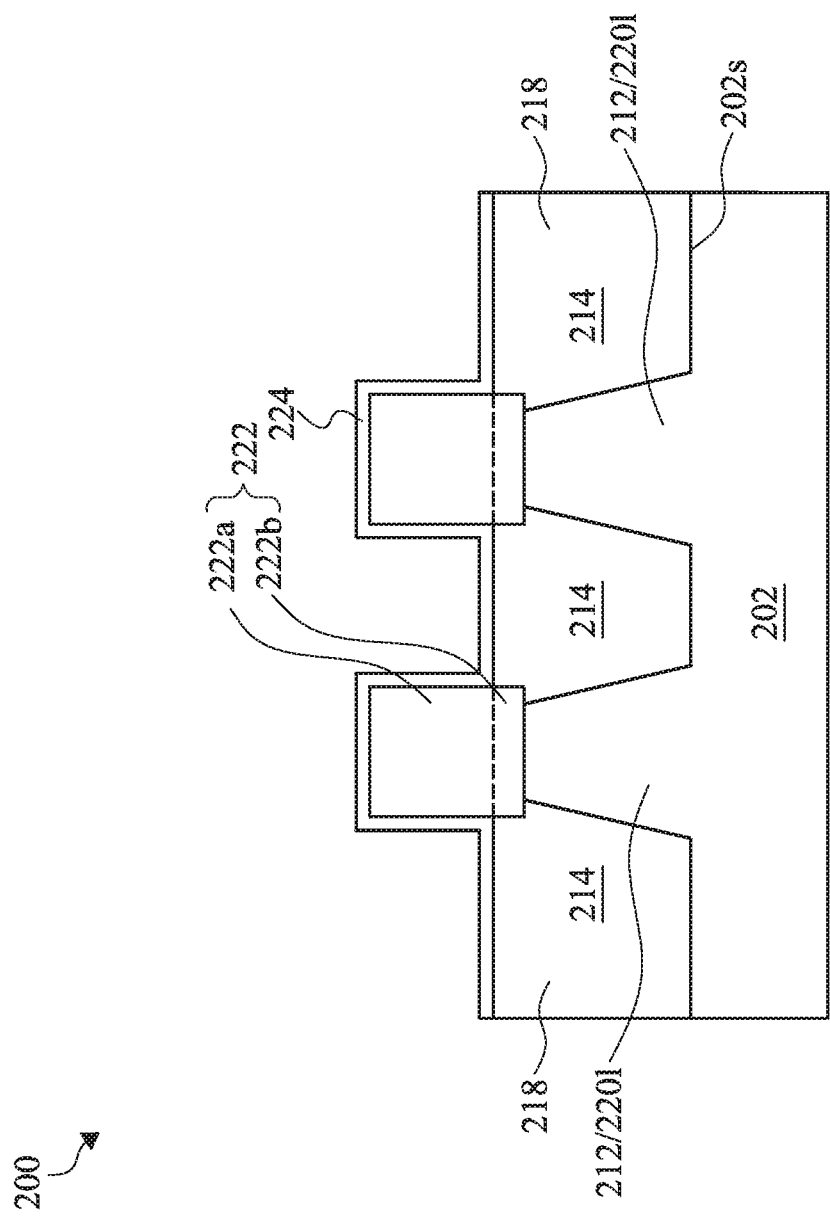

In some embodiments, an optional sacrificial oxide layer 224 is first formed covering the exposed portion 222a of the second semiconductor material 222 and extending over the isolation structure 218 (shown in FIG. 10). In some embodiments, the sacrificial oxide layer 224 may be a thin film comprising silicon oxide formed, for example, using a plasma-enhanced atomic layer deposition (PEALD) process. In one embodiment, the PEALD process is performed at a temperature of about 100° C. to about 350° C. and under a pressure of about 1 Torr to about 100 Torr, using $C_8H_{22}N_2Si$ and $O_3$ (or $O_2$) as reaction gases.

Then, the step of the HPO process 236 to the exposed portion 222a of the second semiconductor material 222 is performed at a temperature of about 300° C. to about 700° C. and under a pressure of about 1 atm to about 25 atm, using $O_2$ as a reaction gas. The reaction gas may further comprise $H_2$, $N_2$, or $H_2O$.

As a result of the oxidation, rather than oxidizing the unexposed portion 222b of the second semiconductor material 222, an HPO oxide 226 of the second semiconductor material 222 is generated. In the depicted embodiment, the HPO oxide 226 extends into (i.e., in an inward direction) the exposed portion 222a of the second semiconductor material 222 and surrounds the remaining exposed portion 222f of the second semiconductor material 222.

In some embodiments, the remaining exposed portion 222f comprises a second substantially vertical portion 222m having a third width $W_3$ less than the second width $W_2$ over the first substantially vertical portion 222b. In some embodiments, a ratio of the third width $W_3$ to the second width $W_2$ is from about 0.3 to about 0.5. In some embodiments, the remaining exposed portion 222f further comprises a first tapered portion 222n between the first substantially vertical portion 222b and the second substantially vertical portion 222m. In some embodiments, the remaining exposed portion 222f further comprises a second tapered portion 222p over the second substantially vertical portion 222m.

In the depicted embodiment, the remaining exposed portion 222f of the second semiconductor material 222 and the unexposed portion 222b of the second semiconductor material 222 are combined and also hereafter referred to as an upper portion 220u of the fin structure 220. As such, the upper portion 220u comprises the second semiconductor material 222 having the second lattice constant. In some embodiments, the upper portion 220u comprises source/drain (S/D) portions and a channel portion between the S/D portions. The channel portion is used to form channel region of the FinFET 200.

In the depicted embodiment, the upper portion 220u of the fin structure 220 and the lower portion 220l of the fin structure 220 are combined and also hereinafter referred to as the fin structure 220. In some embodiments, the lower portion 220l comprises the first semiconductor material 202 having a first lattice constant less than the second lattice constant, wherein a top surface of the lower portion 220l has the first width $W_1$ less than the second width $W_2$. In some embodiments, a ratio of the first width $W_1$ to the second width $W_2$ is from about 0.85 to about 0.95.

Figure 12:
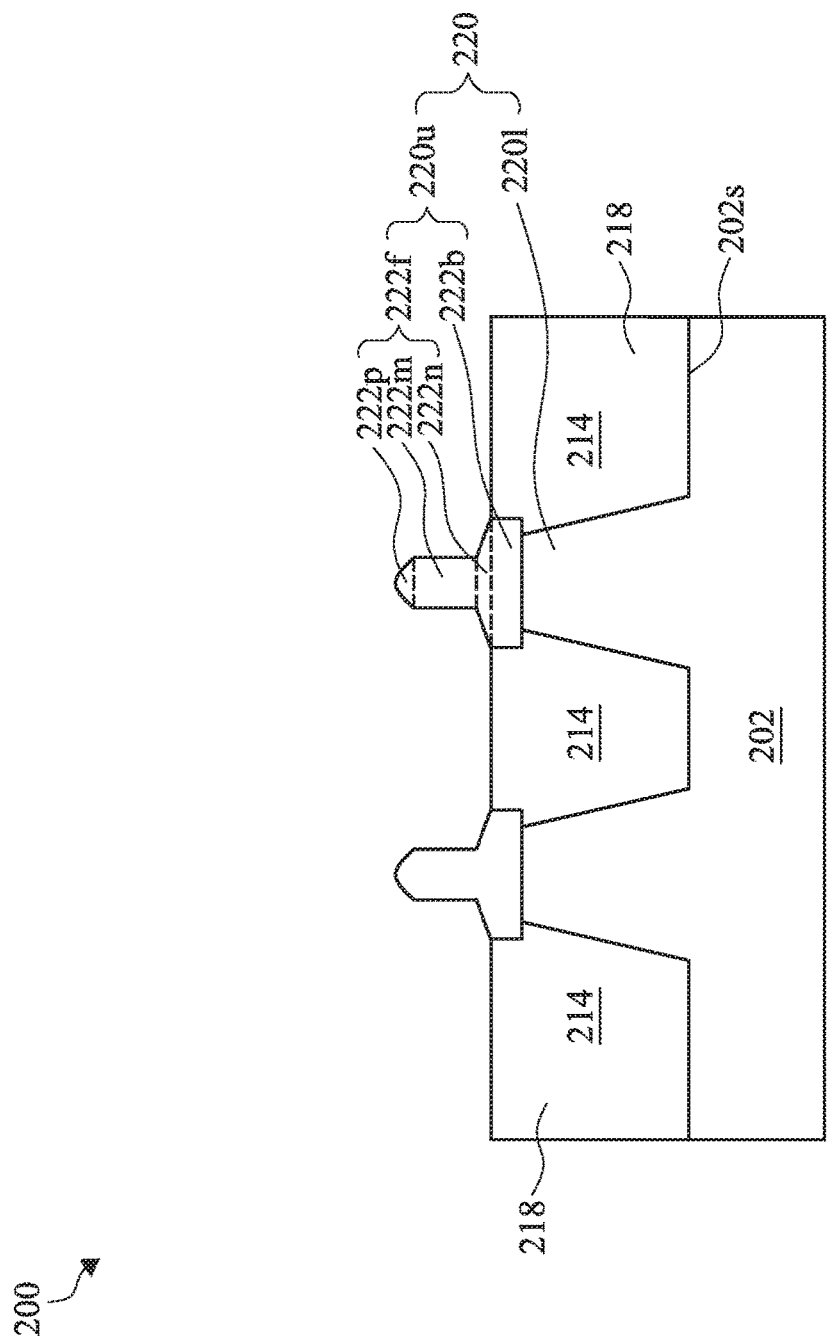

Subsequently, the structure in FIG. 12 is produced by removing the HPO oxide 226 to expose the remaining exposed portion 222f of the second semiconductor material 222. In some embodiments, the removing step may be performed using a wet etching process, for example, by dipping the substrate 202 in hydrofluoric acid (HF). In some embodiments, the removing step may be performed using a dry etching process, for example, the dry etching process may be performed using $CHF_3$ or $BF_3$ as etching gases.

Figure 13:
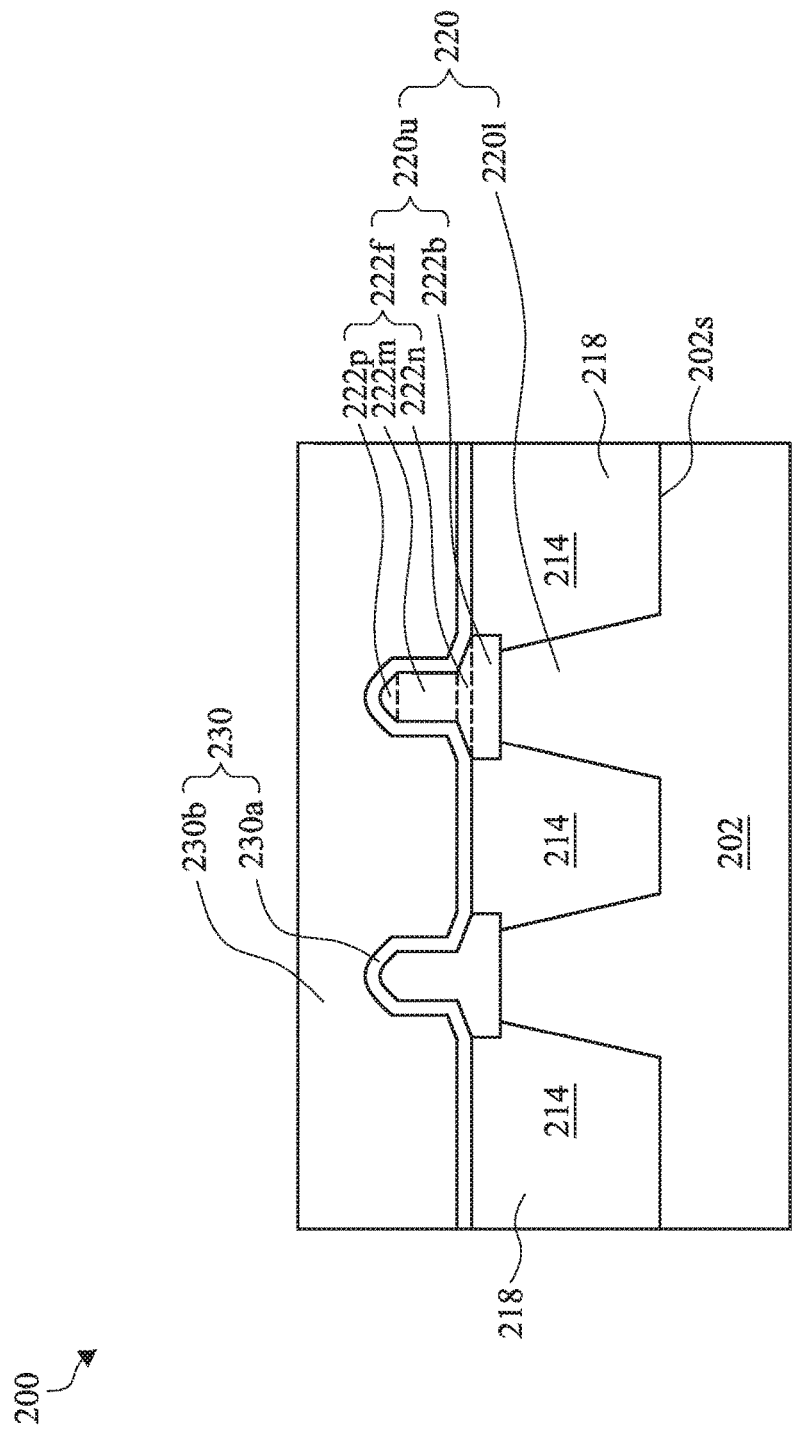

Then, the structure in FIG. 13 is produced by forming a gate structure 230 covering the remaining exposed portion 222f (comprising the second substantially vertical portion 222m, the first tapered portion 222n, and the second taper portion 222p). In some embodiment, the gate structure 230 comprises a gate dielectric 230a and a gate electrode 230b over the gate dielectric 230a.

In some embodiments, the gate dielectric 230a may include silicon oxide, silicon nitride, silicon oxynitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

In some embodiments, the gate electrode layer 230b may comprise poly-silicon. In some alternative embodiments, the gate electrode layer 230b may include a metal such as Al, Cu, W, Ti, Ta, TiN, TiAl, TiAlN, TaN, NiSi, CoSi, other conductive materials with a work function compatible with the substrate material, or combinations thereof.

As such, using the HPO process 236 to form a fin structure with uniform composition distribution, problems associated with high leakage current due to non-uniform composition distribution of the fin structure may be reduced and/or avoided. Thus, Applicant's method may achieve the desired device performance characteristics, such as low leakage current.

It is understood that the FinFET 200 may undergo further CMOS processes to form various features such as contacts/vias, interconnect metal layers, dielectric layers, passivation layers, etc.

In accordance with embodiments, a fin field effect transistor (FinFET) comprises a substrate comprising a major surface; a fin structure protruding from the major surface comprising an upper portion comprising a first semiconductor material having a first lattice constant, wherein the upper portion comprises a first substantially vertical portion having a first width and a second substantially vertical portion having a second width less than the first width over the first substantially vertical portion; and a lower portion comprising a second semiconductor material having a second lattice constant less than the first lattice constant, wherein a top surface of the lower portion has a third width less than the first width; and a gate structure covering the second substantially vertical portion.

In accordance with another embodiments, a fin field effect transistor (FinFET) comprises a substrate comprising a major surface; a fin structure protruding from the major surface comprising an upper portion comprising a first semiconductor material having a first lattice constant, wherein the upper portion comprises a first substantially vertical portion having a first width and a second substantially vertical portion having a second width less than the first width over the first substantially vertical portion; a lower portion comprising a second semiconductor material having a second lattice constant less than the first lattice constant, wherein a first top surface of the lower portion has a third width less than the first width; an isolation structure surrounding the fin structure, wherein a second top surface of the isolation structure is higher than the first top surface; and a gate structure covering the second substantially vertical portion.

In accordance with another embodiments, a method of fabricating a fin field effect transistor comprises providing a substrate; forming a semiconductor fin protruding from a major surface of the substrate comprising a first semiconductor material having a first lattice constant; forming a shallow trench isolation (STI) region surrounding the semiconductor fin; recessing a portion of the semiconductor fin to form a fin recess, whereby a remaining portion of the semiconductor fin forms a lower portion of a fin structure; epi-growing a second semiconductor material filling in the fin recess having a second lattice constant greater the first lattice constant; recessing a portion of the STI region to expose a portion of the second semiconductor material; and performing a high-pressure oxidation (HPO) process to the exposed portion of the second semiconductor material to form an upper portion of the fin structure.

In accordance with an embodiment, a method includes forming a first semiconductor material extending upwards from a semiconductor substrate. The method also includes forming a first shallow trench isolation (STI) region and a second STI region on opposing sides of the first semiconductor material. The method also includes recessing the first semiconductor material below a top surface of the first STI region and a top surface of the second STI region. The method also includes epitaxially growing a second semiconductor material on the first semiconductor material between the first STI region and the second STI region. The method also includes recessing the first STI region and the second STI region below a top surface of second semiconductor material. The method also includes performing a high-pressure oxidation (HPO) process on a portion of the second semiconductor material above the first STI region and the second STI region, wherein the HPO process forms an oxide region of the second semiconductor material around an interior region of the second semiconductor material. The method also includes removing the oxide region of the second semiconductor material to expose the interior region of the second semiconductor material.

In accordance with an embodiment, a method including: forming shallow trench isolation (STI) region around a first semiconductor material, etching the first semiconductor material to define a recess above the first semiconductor material between sidewalls of the STI region, and etching the STI region to widen the recess. After etching the STI region, a bottom surface of the recess includes a material of the STI region and the first semiconductor material. The method further includes epitaxially growing a second semiconductor material in the recess, reducing a height of the STI region to expose sidewalls of the second semiconductor material, and oxidizing a first region of the second semiconductor material without oxidizing a second region of the second semiconductor material. The method further includes removing the first region of the second semiconductor material and forming a gate structure over the second region of the second semiconductor material.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a fin field effect transistor, comprising:
    forming a semiconductor fin protruding from a major surface of a substrate, the semiconductor fin comprising a first semiconductor material having a first lattice constant;
    forming a shallow trench isolation (STI) region adjacent the semiconductor fin;
    recessing a portion of the semiconductor fin to form a recess, wherein a remaining portion of the semiconductor fin forms a lower portion of a fin structure;
    epitaxially growing a second semiconductor material in the recess, the second semiconductor material having a second lattice constant greater the first lattice constant;
    after epitaxially growing the second semiconductor material, recessing a portion of the STI region to expose a portion of the second semiconductor material; and
    performing a high-pressure oxidation (HPO) process to the exposed portion of the second semiconductor material to form an upper portion of the fin structure.

2. The method of claim 1 further comprising forming a sacrificial oxide layer covering the exposed portion of the second semiconductor material before performing the HPO process to the exposed portion of the second semiconductor material.

3. The method of claim 2, wherein forming the sacrificial oxide layer comprises an atomic layer deposition (ALD) process.

4. The method of claim 1, wherein performing the HPO process to the exposed portion of the second semiconductor material to form an upper portion of the fin structure comprises performing the HPO process at a temperature of about 300° C. to about 700° C.

5. The method of claim 1, wherein performing the HPO process to the exposed portion of the second semiconductor material to form an upper portion of the fin structure comprises performing the HPO process at a pressure of about 1 atm to about 25 atm.

6. The method of claim 1, wherein performing the HPO process to the exposed portion of the second semiconductor material to form an upper portion of the fin structure comprises using an oxygen-containing reaction gas.

7. The method of claim 1 further comprising after recessing the portion of the semiconductor fin to form the recess, performing a cleaning to remove a native oxide on a surface of the semiconductor fin exposed in the recess.

8. The method of claim 7, wherein performing the cleaning etches the STI region and expands the recess.

9. The method of claim 1, wherein the HPO process further forms an oxide region around the upper portion of the fin structure, and wherein the method further comprises:
    removing the oxide region; and
    forming a gate structure in direct contact with the upper portion of the fin structure.

10. A method comprising:
    forming a first semiconductor material extending upwards from a semiconductor substrate;
    forming a first shallow trench isolation (STI) region and a second STI region on opposing sides of the first semiconductor material;
    recessing the first semiconductor material below a top surface of the first STI region and a top surface of the second STI region;
    epitaxially growing a second semiconductor material on the first semiconductor material between the first STI region and the second STI region;
    recessing the first STI region and the second STI region from at least a top surface of the second semiconductor material to below the top surface of second semiconductor material;
    performing a high-pressure oxidation (HPO) process on a portion of the second semiconductor material above the first STI region and the second STI region, wherein the HPO process forms an oxide region of the second semiconductor material around an interior region of the second semiconductor material; and
    removing the oxide region of the second semiconductor material to expose the interior region of the second semiconductor material.

11. The method of claim 10 further comprising:
    depositing a gate dielectric over and along sidewalls of the second semiconductor material; and
    forming a gate electrode over the gate dielectric.

12. The method of claim 11, wherein after removing the oxide region, remaining portions of the second semiconductor material and the first semiconductor material define a fin structure, wherein the fin structure comprises:
    a lower portion having a first width measured between opposing sidewalls of the lower portion;
    an upper portion over the lower portion and having a second width measured between opposing sidewalls of the upper portion, wherein the second width is greater than the first width; and
    a channel region over the upper portion and having a third width measured between opposing sidewalls of the channel region, wherein the third width is less than the second width, and wherein a line perpendicular to a major surface of the semiconductor substrate extends through the channel region, the lower portion, and the upper portion.

13. The method of claim 10, wherein removing the oxide region of the second semiconductor material comprises a wet etching process or dry etching process.

14. The method of claim 10 further comprising before epitaxially growing the second semiconductor material on the first semiconductor material between the first STI region and the second STI region, etching the first STI region and the second STI region to increase a distance between the first STI region and the second STI region over the first semiconductor material.

15. The method of claim 10, wherein the first semiconductor material has a different lattice constant than the second semiconductor material.

16. A method comprising:
    forming shallow trench isolation (STI) region around a first semiconductor material;
    etching the first semiconductor material to define a recess above the first semiconductor material between sidewalls of the STI region;
    etching the STI region to widen the recess, wherein after etching the STI region, a bottom surface of the recess comprises a material of the STI region and the first semiconductor material;
    epitaxially growing a second semiconductor material in the recess;

after epitaxially growing the second semiconductor material in the recess, reducing a height of the STI region to expose sidewalls of the second semiconductor material;

oxidizing a first region of the second semiconductor material without oxidizing a second region of the second semiconductor material;

removing the first region of the second semiconductor material; and forming a gate structure over the second region of the second semiconductor material.

17. The method of claim 16, wherein oxidizing the first region of the second semiconductor material comprises performing a high pressure oxidation (HPO) process on the second semiconductor material.

18. The method of claim 17 further comprising before performing the HPO process, forming a sacrificial oxide over and along sidewalls of the second semiconductor material using an atomic layer deposition (ALD) process.

19. The method of claim 17, wherein the HPO process comprises performing the HPO process at a temperature of about 300° C. to about 700° C. and at a pressure of about 1 atm to about 25 atm using an oxygen-containing reaction gas.

20. The method of claim 16, wherein etching the STI region comprises using diluted hydrogen fluoric (DHF) acid to etch the STI region and remove an oxide of the second semiconductor material.

* * * * *